US006429668B1

(12) United States Patent
Billen et al.

(10) Patent No.: US 6,429,668 B1
(45) Date of Patent: Aug. 6, 2002

(54) SWITCHING ELEMENT PRODUCED IN THE FORM OF A FILM

(75) Inventors: Karl Billen, Körperich (DE); Laurent Federspiel, Asselscheuer (LU); Edgard Theiss, Kelmis (BE)

(73) Assignee: I.E.E. International Electronics & Engineering S.A.R.L., Luxembourg (LU)

( * ) Notice: Subject to any disclaimer, the term of this patent is extended or adjusted under 35 U.S.C. 154(b) by 20 days.

(21) Appl. No.: 09/624,137

(22) Filed: Jul. 21, 2000

Related U.S. Application Data

(63) Continuation of application No. PCT/EP99/00260, filed on Jan. 18, 1999.

(30) Foreign Application Priority Data

Jan. 21, 1998 (LU) ................................................ 90200

(51) Int. Cl.[7] ................................................ G01R 27/08
(52) U.S. Cl. ........................................ 324/699; 324/716
(58) Field of Search ........................... 73/862; 205/717; 338/114; 428/172; 200/43.17, 600, 181, 511, 512, 514; 324/699, 693, 716

(56) References Cited

U.S. PATENT DOCUMENTS

| | | | | |
|---|---|---|---|---|
| 4,145,317 A | | 3/1979 | Sado et al. | 252/512 |
| 4,419,653 A | * | 12/1983 | Waigand | 338/114 |
| 4,495,236 A | * | 1/1985 | Obara et al. | 428/172 |
| 5,431,064 A | * | 7/1995 | Franz | 73/862 |
| 5,508,700 A | * | 4/1996 | Tayler et al. | 200/600 |
| 5,900,135 A | * | 5/1999 | Zitzmann | 205/717 |
| 5,986,221 A | * | 11/1999 | Stanley | 200/512 |
| 6,289,747 B1 | * | 9/2001 | Billen et al. | 73/862 |

* cited by examiner

*Primary Examiner*—Michael J. Sherry
*Assistant Examiner*—Anand B. Amin
(74) *Attorney, Agent, or Firm*—Venable; George H. Spencer; Catherine M. Voorhees

(57) ABSTRACT

A switching element of foil construction is presented, with a triggering layer of first resistive material applied to a first carrier-foil and a sensor layer of a second resistive material applied to a second carrier-foil. The two carrier-foils are arranged a certain distance from each other by means of spacers, in such a way that the triggering layer and the sensor layer are opposite each other and, when the switching element is not operated, are not in contact with each other, whereas, when the switching element is triggered, the triggering layer and the sensor layer are initially in contact with each other at a first point of their surface, and the area of contact increases as the pressure on the switching element is increased. The first and second resistive materials are tuned to each other in such a way that, when there is contact between the triggering layer and the sensor layer, the resistive of the boundary layer between the triggering layer and the sensor layer is essentially determined by the extent of the contact area. According to the invention, the sensor layer is designed so that, starting from the first point, its electrical resistivity varies with the distance from the first point in the direction increasing contact-area, in such a way that a predetermined triggering behavior of the switching element as a function of the compressive force acting on the switching element is obtained.

16 Claims, 1 Drawing Sheet

SWITCHING ELEMENT PRODUCED IN THE FORM OF A FILM

CROSS-REFERENCE TO RELATED APPLICATION

This application is a continuation of International Application No. PCT/EP99/00260, filed Jan. 18, 1999, the entire specification of which is incorporated herewith by reference.

The present invention relates to a switching element of foil construction, which, when triggered, generates a signal dependent on the size of the triggered area.

Such a switching element of foil construction embodies a first carrier-foil, to which a triggering layer of a first resistive material, e.g. graphite, is applied, and a second carrier-foil, to which a sensor layer of a second resistive material, e.g. a semiconductor material, is applied. The first resistive material and the second resistive material are tuned to each other in such a way that, when there is contact between the triggering layer and the sensor layer, the boundary layer between the triggering layer and the sensor layer is essentially governed by the expansion of the area of contact.

The first carrier-foil and the second carrier-foil are arranged a certain distance from each other by means of spacers, in such a way that the triggering layer and the sensor layer are opposite and, when the switching element has not been operated, are not in contact with each other. When the switching element is triggered or operated, the triggering layer and the sensor layer are moved towards each other in opposition to the resetting force of the carrier-foils and come into contact with each other. With small triggering forces, the two layers are in contact with each other at a first point of their surface; the area of contact increases as the pressure on the switching element is increased.

If the electrical resistance of the switching element is measured, a characteristic quantity is obtained which is a directly dependent on the area of mutual contact, and which. taking account of the resetting force of the carrier-foils, permits conclusions to be drawn concerning the triggering forces acting on the switching element. For this reason, such switching elements can be used as pressure sensors, for example.

Such pressure sensors can be manufactured cost-effectively and have proved to be extremely robust and reliable in practice. The triggering performance and the dynamics of such pressure sensors are, however, unsuitable for certain applications. Whereas, in the case of sensors which are generally round, the radial expansion of the triggered area is essentially a linear function of the force exerted on the switching element, an essentially quadratic dependence is obtained for the contact area. The resistance behaviour of the sensor as a function of the triggering force consequently exhibits a characteristic determined by this quadratic dependence, which renders the sensors unsuitable for particular applications.

Problem of the Invention

The problem of the present invention is consequently to propose such a switching element of foil construction which enables the triggering performance to be matched to the application concerned.

SUMMARY OF THE INVENTION

According to the invention, this problem is solved by a switching element of foil construction, with a first carrier-foil, to which a triggering layer of a first resistive material is applied, wherein the triggering layer has a first electrical terminal, and a second carrier-foil, to which a sensor layer consisting of a second resistive material is applied, wherein the sensor layer has a second electrical terminal. The first carrier-foil and the second carrier-foil are arranged a certain distance from each other by means of spacers, in such a way that the triggering layer and the sensor layer are opposite each other and, when the switching element is not operated, are not in contact with each other, whereas, when the switching element is triggered, the triggering layer and the sensor layer are initially in contact with each other at a first point of their surface, and the area of contact increases as the pressure on the switching element is increased. The first resistive material and the second resistive material are tuned to each other in such a way that, when there is contact between the triggering layer and the sensor layer, the resistance of the boundary layer between the triggering layer and the sensor layer is essentially determined by the size of the contact area. According to the invention, the sensor layer is designed in such a way that, starting from the first point, its electrical resistivity varies with the distance from the first point in the direction of increasing contact-area, in such a way that a predetermined triggering behaviour of the switching element as a function of the compressive force acting on the switching element is obtained.

Besides being determined by the resistance of the boundary layer between the triggering layer and the sensor layer, the triggering behaviour of such a switching element is also determined by the resistance in the sensor layer between the triggering point and the second electrical terminal. An electrical signal, e.g. an electrical voltage, applied to the sensor layer via the boundary layer at a triggering point, must in fact be dissipated via the resistance section between the triggering point and the second terminal.

By deliberate variation of the resistivity across this resistance section, the voltage drop in the resistance section can consequently be influenced as a function of the triggering point, so that the triggering performance of the switching element can be linearised, for example. Such a switching element can consequently be optimised in respect of its triggering performance, i.e. its dynamics, for any application.

In a preferred development of the switching element, the varying resistivity is produced by the deliberate addition of a third resistive material to the second resistive material, wherein the resistivity of the third resistive material and the resistivity of the second resistive material are different from each other, and wherein the concentration of the third resistive material varies with the distance from the first point. The variation of the resistivity can be brought about, for example, by adding a low-resistance material, e.g. silver, to a high-resistance semiconductor material, wherein the resistivity of the sensor layer becomes smaller as the quantity of added material is increased. Conversely, the variation can also be brought about by adding a high-resistance material to a layer of low-resistance material.

The third resistive material is preferably added to the second resistive material in the form of local inclusions. This kind of addition permits simple manufacture of the sensor layer, at the same time as good control of the concentration of the third resistive material in the sensor layer. The dependence of the concentration of the third resistive material can, for example, be brought about by a particular spatial arrangement of inclusions of equal extent or by a regular spatial arrangement of inclusions with different extents, or by a combination of the two.

The second resistive material preferably exhibits a semiconductor material, and the third resistive material has an appreciably lower resistance than the second resistive material. The semiconductor material can, for example, incorporate semiconductor ink used in the manufacture of foil pressure-sensors, with which the required area-effect can be advantageously brought about at the boundary layer with a graphite triggering layer, while the third resistive material includes silver.

In the manner described above, the resistivity of the sensor layer, starting from the first point, for example the centre of a round switching element, can increase in a radial direction in proportion to the distance from the first point. The distances chosen are derived from the desired sensor dynamics.

The inclusions are advantageously electrically insulated from the second electrical connection terminal. This prevents the switching element from completely switching through as a result of inclusions extending into the boundary layer between triggering layer and sensor layer, thereby rendering pressure detection impossible.

In addition, the inclusions are preferably completely covered by the second resistance material on the side facing the triggering layer. The covering layer consisting of the second resistive material on the one hand prevents direct switching-through of the triggering layer to the inclusions, and on the other acts as a protective layer against mechanical damage.

The triggering layer of the switching element can include a resistive material with a uniform resistivity. This can, for example, be a graphite layer, which can easily be produced in a screen printing process. In an alternative development, the triggering layer can be built up similar to the sensor layer, i.e. the triggering layer exhibits a resistivity which, starting from the first point, varies with the distance from the first point in the direction of increasing contact-area. The characteristic of the resistivity in the triggering layer can correspond to the characteristic of the resistivity in the sensor layer or can exhibit a completely different characteristic.

BRIEF DESCRIPTION OF THE DRAWINGS

In the following, advantageous developments of the invention are described by reference to the attached figures, which show.

DETAILED DESCRIPTION OF THE INVENTION

Figure 1:
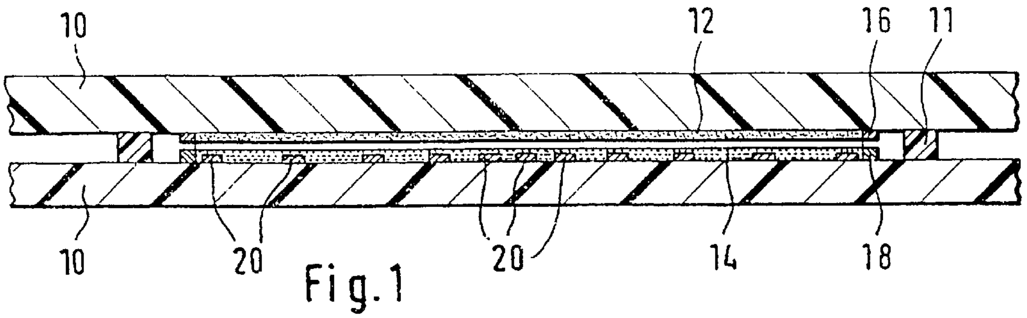
FIG. 1: a section through a first development of a switching element of foil construction

FIG. 1 represents a section through a round switching element of foil construction, which, when triggered, generates a signal dependent on the size of the triggered area.

It consists essentially of two carrier-foils 10 which are arranged a certain distance apart by means of a spacer 11. A triggering layer 12 consisting of a first resistive material, e.g. graphite, is applied to one carrier-foil, while a sensor layer 14 consisting of a second resistive material, e.g. a semiconductor ink as used in the manufacture of foil pressure-sensors, is applied to the other carrier-foil, opposite the triggering layer 12. At the edge, the triggering layer 12 and the sensor layer 14 have an electrical connection terminal, respectively 16 and 18.

The resistive material of the triggering layer 12 and the resistive material of the sensor layer are tuned to each other in such a way that, when there is contact between the triggering layer 12 and the sensor layer 14, the resistance of the boundary layer between the triggering layer 12 and the sensor layer 14 is essentially determined by the extent of the contact area.

When the switching element is triggered, the two carrier-foils 10 are pressed together in opposition to their respective resetting forces, until contact occurs between the triggering layer 12 and the sensor layer 14. Contact between the two layers takes place initially in the middle of the two layers, wherein the area of contact expands radially outwards as the force on the switching element is increased. Since the linear extent of the contact area increases essentially linearly with the force exerted, the size of the contact area accordingly increases quadratically with the force. For a conventional switching element, a triggering behaviour in which the electrical resistance declines roughly quadratically with the force is thereby obtained.

In order to linearise this triggering performance, the switching element represented has inclusions 20 of a third resistive material, wherein the third resistive material, e.g. silver, has an appreciably lower resistivity than the second resistive material. Through a suitable distribution of the inclusions 20, the resistivity of the sensor layer 14 can be varied with the distance from the centre of the switching element in such a way that the non-linear triggering behaviour described above is equalised. In the embodiment reproduced, the inclusions 20 are arranged, for example, in rings round the centre of the switching element, wherein the distance between two adjoining rings increases in an outward direction.

When the switching element is triggered, an electrical voltage applied to the terminal 16 of the triggering layer 12 is transmitted via the boundary layer to the sensor layer 14. The voltage is then essentially between the edge of the contact area and the terminal 18 of the sensor layer 14. The signal must consequently pass through the resistance section between these points in the sensor layer 14. By virtue of the variation of the resistivity of the sensor layer 14, the resistance of this resistance section is greatly dependent on the expansion of the contact area, so that the triggering behaviour referred to above can be largely linearised.

It should be noted here that, as an alternative to a linear triggering performance, where the electrical resistance of the switching element is proportional to the force exerted on the switching element, basically any dependence is made possible by a suitable arrangement of the inclusions 20.

Figure 2:
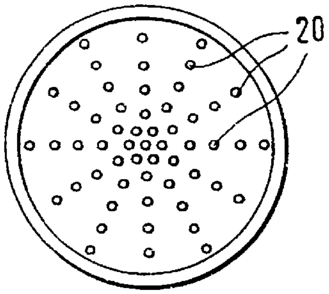
FIG. 2: a plan view of an alternative distribution of inclusions in the sensor layer of the switching element
Figure 3:
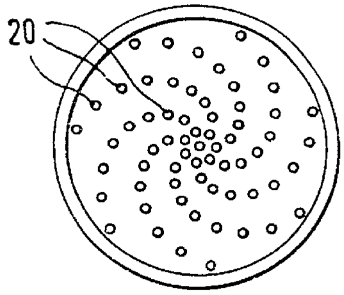
FIG. 3: a plan view of another distribution of inclusions in the sensor layer of the switching element

FIG. 2 and FIG. 3 represent different distributions of the inclusions 20, similarly resulting in linearisation of the triggering performance of the switching element. In FIG. 2, the inclusions 20 are arranged essentially radially, wherein the radial distance between two adjoining inclusions is essentially constant, whereas the inclusions 20 of the development in FIG. 3 are arranged on spiral paths. What is common to all the distributions is that the quantity of material added to a circle round the centre decreases with the distance from the centre.

Figure 4:
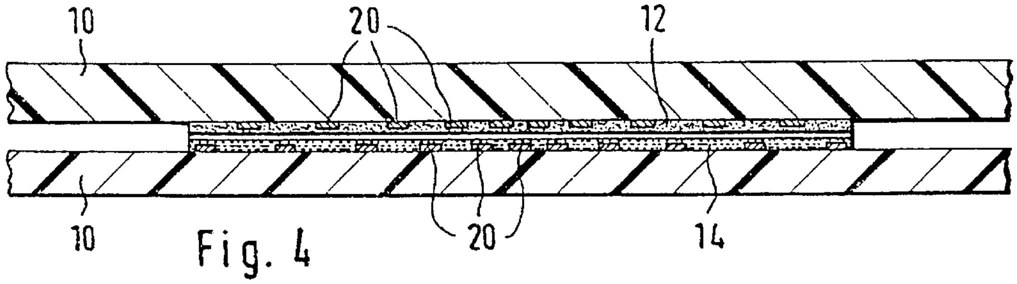
FIG. 4: a section through a second development, in which the triggering layer also exhibits a varying resistivity

In the development of the switching element represented in FIG. 4, the triggering layer 12 has, similarly to the sensor layer 14, inclusions 20. The inclusions 20 in the triggering layer 12 are arranged at different points relative to the centre of the switching element, compared with the inclusions in the sensor layer 14. In this way, an even more complex matching of the triggering performance to a given task can take place.

Figure 5:
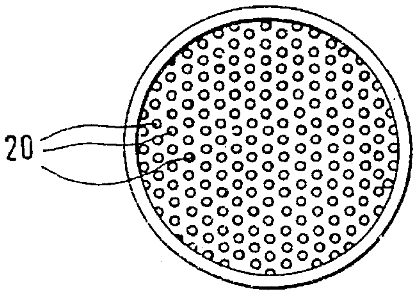
FIG. 5: a switching element with an alternative triggering behaviour

In FIG. 5, a distribution of the inclusions 20 is represented, in which the inclusions are uniformly distributed over the area of the sensor layer 14. Such a distribution of the inclusions produces a triggering performance which is very similar to conventional switching elements. The effect of resistance fluctuations in the high-resistance second resistive material on the resistivity of the layer concerned is, however, greatly reduced by the addition of the low-resistance material to the sensor layer. Differences in quality between different switching elements can thereby be largely prevented during series production.

What is claimed is:

1. Switching element of foil type construction comprising:

a first carrier-foil, to which a triggering layer consisting of a first resistive material is applied, wherein the triggering layer comprises first electrical terminal;

a second carrier-foil, to which a sensor layer consisting of a second resistive material is applied, wherein the sensor layer comprises a second electrical terminal;

wherein the first carrier-foil and the second carrier-foil are arranged a certain distance from each other by means of spacers, in such a way that the triggering layer and the sensor layer are opposite each other and, when the switching element has not been operated, are not in contact with each other, wherein the first resistive material and the second resistive material are tuned to each other in such a way that, when the triggering layer and the sensor layer are in contact, the resistance of the boundary layer between the triggering layer and the sensor layer is essentially determined by the size of the area of contact, and wherein, when the switching element is triggered, the triggering layer and the sensor layer are initially in contact with each other at a first point of their surface, and the contact area increases as the pressure on the switching element is increased, wherein the improvement comprising the sensor layer is designed so that, starting from the first point, its electrical resistivity varies with the distance from the first point in the direction of increasing contact-area, in such a way that a predetermined triggering behavior of the switching element as a function of the compressive force acting on the switching element is obtained.

2. Switching element according to claim 1, wherein the varying resistivity is produced by the specific addition of a third resistive material into the second resistive material, wherein the resistivity of the third resistive material and the resistivity of the second resistive material are different from each other and wherein the concentration of the third resistive material varies with the distance from the first point.

3. Switching element according to claim 2, wherein the third resistive material is embedded in the second resistive material in the form of local inclusions.

4. Switching element according to claim 3, wherein the distribution of the local inclusions in the second resistive material varies with the distance from the first point.

5. Switching element according to claim 3, wherein the extent of the local inclusions varies with the distance from the first point.

6. Switching element according to claim 1, wherein the second resistive material exhibits a semiconductor material, and that the third resistive material has an substantially lower resistance than the second resistive material.

7. Switching element according to claim 1, wherein the resistivity of the sensor layer increases in a radial direction with the distance from the first point.

8. Switching element according to claim 3, wherein the inclusions are electrically insulated from the second electrical terminal.

9. Switching element according to claim 3, wherein the inclusions are, on the side facing the triggering layer, completely covered by the second resistive material.

10. Switching element according to claim 1, wherein the triggering layer has a resistivity which, starting from the first point, varies with the distance from the first point in the direction of increasing contact-area.

11. Switching element according to claim 3, wherein the distribution and/or the extension of the local inclusions varies with the distance from the first point.

12. Switching element according to claim 11, wherein the second resistive material comprises a semiconductor material, and wherein the third resistive material has a substantially lower resistance than the second resistive material.

13. Switching element according to claim 11, wherein the inclusions are electrically insulated from the second electrical terminal.

14. Switching element according to claim 11, wherein the inclusions are, in the side facing the triggering layer, completely covered by the second resistive material.

15. Switching element according to claim 11, wherein the triggering layer has a resistivity which, starting from the first point, varies with the distance from the first point in the direction of increasing contact-area.

16. Switching element according to claim 2, wherein the resistivity of the sensor layer increases in a radial direction with the distance from the first point.

* * * * *